US 6,537,713 B2

(12) United States Patent
Yeo

(10) Patent No.: US 6,537,713 B2
(45) Date of Patent: Mar. 25, 2003

(54) MULTILAYER ALIGNMENT KEYS AND ALIGNMENT METHOD USING THE SAME

(75) Inventor: Gi-Sung Yeo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 116 days.

(21) Appl. No.: 09/761,618

(22) Filed: Jan. 16, 2001

(65) Prior Publication Data

US 2001/0014531 A1 Aug. 16, 2001

(30) Foreign Application Priority Data

Feb. 11, 2000 (KR) .......................................... 2000-6448

(51) Int. Cl.⁷ ................................................. G03F 9/00
(52) U.S. Cl. ......................................... 430/22; 257/797
(58) Field of Search ............................. 430/22; 257/797

(56) References Cited

U.S. PATENT DOCUMENTS 6,248,484 B1 * 6/2001 Sajan et al. .................... 430/22

* cited by examiner

*Primary Examiner*—Christopher G. Young
(74) *Attorney, Agent, or Firm*—Mills & Onello LLP

(57) ABSTRACT

Multilayer alignment keys in an integrated structure and a method of aligning using the keys are provided. Alignment keys are formed on a semiconductor substrate in a multilayer structure. The length of the alignment key in one layer can be different from that of the alignment key in underlying and/or overlying layer. Alternatively, the number of alignment keys can be different in each layer. Thus alignment weight can be imposed differently on each layer, thereby increasing alignment accuracy.

21 Claims, 6 Drawing Sheets

MULTILAYER ALIGNMENT KEYS AND ALIGNMENT METHOD USING THE SAME

This application relies for priority upon Korean Patent Application No. 200006448, filed on Feb. 11, 2000, the contents of which are herein incorporated by reference in their entirety.

Background of the Invention

1. Field of the Invention

The present invention relates to a semiconductor manufacturing, and more particularly to a multilayer alignment key and an alignment method using the same.

2. Description of the Related Art

To increase integrated circuit density, integrated circuit feature sizes continue to decrease, which results in decreased line pattern size. Particularly, density of DRAM (Dynamic Random Access Memory) devices reaches giga bit areas and thus the size of cell elements, such as transistors and capacitors, is significantly decreased. Semiconductor manufacturing requires a series of processing steps. These processing steps include depositing a variety of material layers to form cell elements and metal interconnection. Such processing steps require formation of contacts for electrical connection between cell elements and metal interconnections.

The deposited layers are typically patterned into predetermined configurations using a photoresist layer that is patterned over the material layers by exposing the photoresist through a photomask or reticle. The photoresist is then developed to provide the pattern. Typically, the photomask or reticle has alignment marks (or keys) that are aligned to alignment keys formed on the substrate at the previous processing step. It is important to align one masking level to the previous level.

FIG. 1 is a top plan view of a DRAM cell. Referring to FIG. 1, an elliptic-like active region 12 is defined in a semiconductor substrate 10, and a pair of gate patterns 14 run across the active region 12. A bit line 16b runs outside of the active region 12, intersecting the gate patterns 14. The bit line 16b electrically contacts with the active region 12 between the gate patterns 14 at a common drain region through a bit line contact 16a. Storage electrodes are disposed over the bit line to be electrically connected to the both ends of the active region 12 outside of the gate patterns at source regions through storage electrodes contact plugs 18. Such patterns are formed through photolithographic processes which include alignment and etching steps.

For alignment, it is important to form a contact hole for electrical connection between the upper pattern and the lower pattern. One example is the connection between the source region and the storage electrode. In FIG. 1, for the storage electrode contact, a contact hole is formed and a conductive material is deposited in the contact hole to form the contact plug 18. At this time, it is necessary to exactly align the contact plug 18 to the active region, i.e., source region, to prevent a short or bridge with the gate patterns 14 or bit line 16b.

SUMMARY OF THE INVENTION

Therefore, it is an object of the present invention to provide alignment keys and a method of using the alignment keys to align upper and lower patterns without causing a short or bridge.

In one aspect, the invention is directed to alignment keys for aligning multiple layers in an integrated structure. The keys are formed in multiple stacked layers on a substrate. Each of the multiple stacked layers includes at least one alignment key disposed in the layer along a first direction. One or more other alignment keys in one or more respective other layers are disposed along the first direction such that a plurality of alignment keys in a respective plurality of layers are in alignment.

In one embodiment, the alignment keys have a rod-like rectangular shape. The length of the alignment keys in one layer can be different from that of other alignment keys in other layers, thereby imposing a different alignment weight. Also, the number of alignment keys in different layers can be different, thereby imposing a different alignment weight in each alignment key.

In one embodiment, a portion of at least one alignment key in a first layer overlaps a portion of another alignment key in another layer. The amount of overlap between keys on multiple layers can be different at each layer.

The alignment keys can have a concave shape. Alternatively, the keys can have a convex shape.

Thus, a feature of the present invention is to form multilayer alignment keys. In general, each alignment key can be formed in a different layer in the same direction.

In accordance with another aspect, the present invention is directed to a method for making alignment keys on a substrate and determining an alignment position of the substrate. Multilayered alignment keys are formed on the substrate such that the alignment keys on multiple layers are arranged in the same direction such that multiple alignment keys on multiple layers are in alignment. Light is directed into the substrate with the multilayered alignment keys. Information is received from light that is incident upon the substrate and the alignment keys, i.e., light that is reflected and/or scattered from the substrate and/or the keys. The alignment position is determined using the received information.

In one embodiment, a broadband light is directed onto the entire area of the substrate in which the multilayered alignment keys are formed. In receiving the information related to the light, scattered and/or reflected light from the alignment keys in each layer is downward detected, and the detected light is converted to an electrical signal. A convolution is then performed on the electrical signal. In one embodiment, the downward detection is carried out at a predetermined interval in a discrete time manner. In one embodiment, the light is monochromatic light.

In one embodiment, in receiving the information, diffracted light from the alignment keys in each layer is detected. The number of alignment keys in each layer is determined using the diffracted light, and an alignment weight is imposed on each layer. An imaginary signal is introduced to each layer, and the appropriate alignment weight is applied to each imaginary signal.

In determining the alignment position, convolutions are performed on electrical signals obtained from each alignment key in different layers, and a relation in an X-Y coordinate system is obtained. A maximum Y value is obtained from the convolutioned electrical signal. A reference Y value that has a predetermined ratio with respect to the maximum Y value is determined. Two X values are obtained from the reference Y value in the convolutioned electrical signal, and a middle point of the two X values is determined as the alignment position. In one embodiment, the X axis of the relation represents the position of the alignment keys, and the Y axis represents the intensity of the electrical signals.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
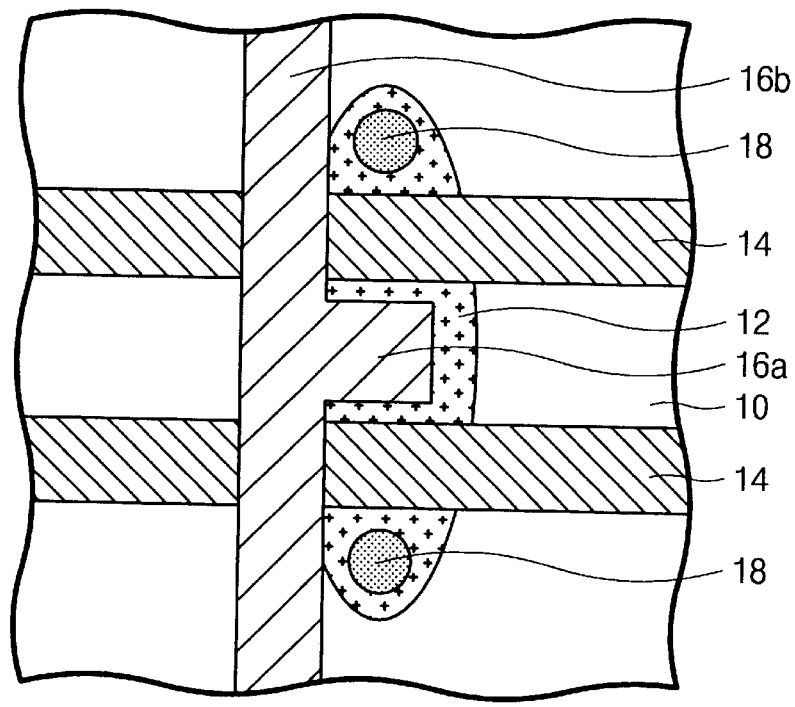
FIG. 1 is a top plan view of a DRAM cell pattern.

The present invention will now be described more fully hereinafter with reference to the accompanying drawings, in which preferred embodiments of the invention are shown. In the drawings, the thickness of layers and regions are exaggerated for clarity. It will also be understood that when a layer is referred to as being "on" another layer or substrate, it can be directly on the other layer or substrate or intervening layers may also be present. Moreover, each embodiment described and illustrated herein includes its complementary conductivity type embodiment as well.

The present invention is related to alignment keys. The present invention uses multilayer alignment keys. The alignment key in each layer can be different in size with and of the same number. Alternatively, the alignment keys in each layer can be different in number with the same size. As a result, alignment weights can be imposed differently in each layer. Alternatively, alignment keys in each layer can be overlapped, with different overlapping dimensions from layer to layer.

Figure 2A:
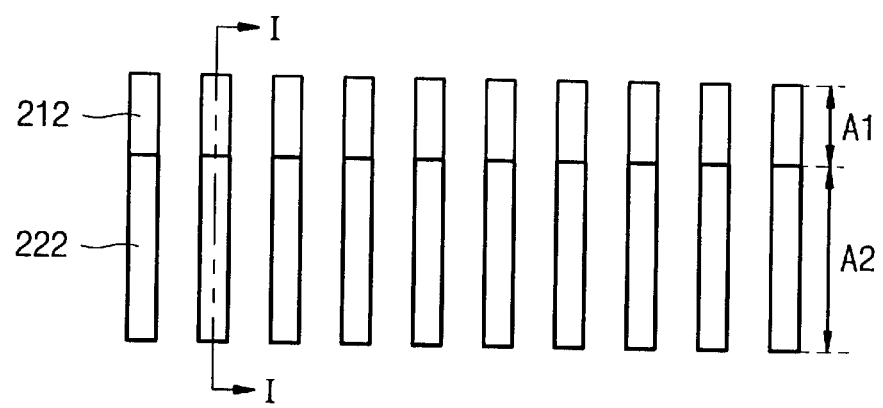
FIG. 2A is a top plan view of a double layer alignment key used in a projection mode aligning according to an embodiment of the present invention.
Figure 2B:
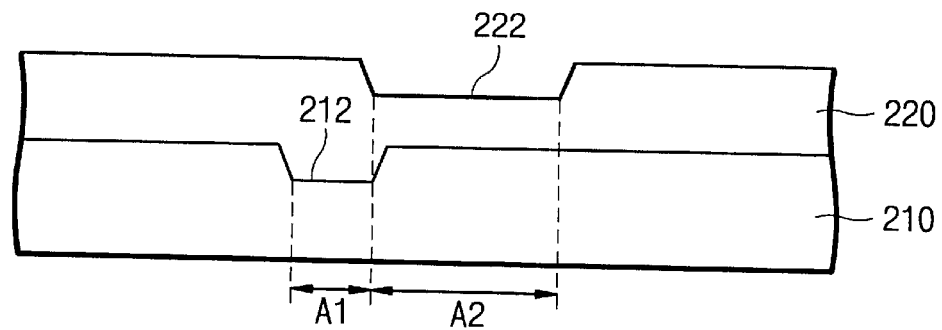
FIG. 2B is a cross-sectional view taken along line I—I of FIG. 2A according to the present invention.

FIG. 2A schematically shows a top plan view of a double layer alignment key used in a projection mode aligning in accordance with the invention, and FIG. 2B is a cross-sectional-view taken along line I—I of FIG. 2A. The alignment keys shown in FIGS. 2A and 2B are formed by the following process steps. First, a first material layer 210 is formed on a semiconductor substrate. First alignment keys 212 are formed in the first material layer 210. A second material layer 220 is formed on the first material layer 210. Second alignment keys 222 are formed in the second material layer 220. In one embodiment, alignment keys are rod-like rectangular form and are arranged in the same direction. In FIG. 2A, alignment keys in the same layer are arranged in a predetermined direction with the longer sides facing each other, for example, along an x-axis. But, considering the two alignment keys 212 and 222 in different layer, they are arranged in a y-axis to be in line.

The alignment keys in this embodiment are concave in shape, and are formed by forming trenches in the previously deposited layer. Alternatively, alignment keys can be convex in shape. The alignment keys are of rectangular shape and the shorter side of the alignment key in one layer is facing the shorter side of the alignment key in another layer and each shorter side is in contact seen from a top plan view. The first alignment keys 212 and the second alignment keys 222 are different in length size (respectively A1:A2), having a predetermined ratio therebetween. For example, the length ratio(A1:A2) between the first alignment keys 212 and the second alignment keys 222 is about A1:A2=3:7. Due to the difference in length size between alignment keys, alignment weight can be differently imposed on each layer.

Figure 3A:
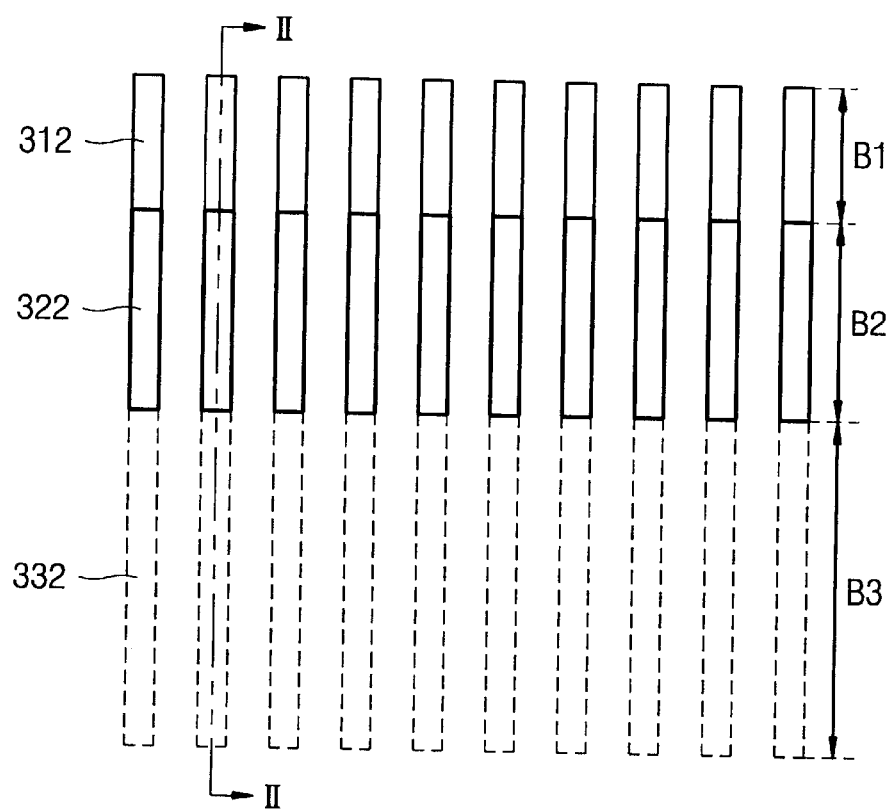
FIG. 3A is a top plan view of a triple layer alignment key used in a projection mode aligning according to an embodiment of the present invention.
Figure 3B:
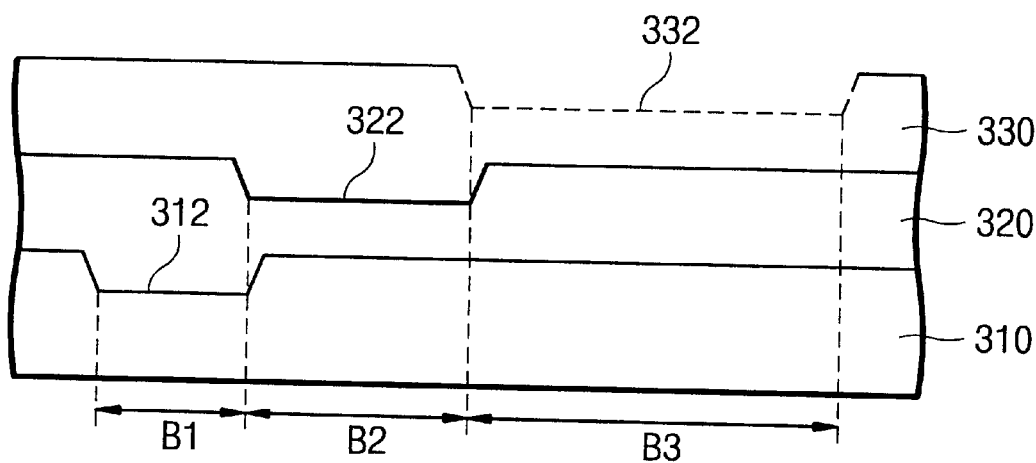
FIG. 3B is a cross-sectional view taken along line II—II of FIG. 3A.

FIG. 3A is a top plan view of a triple layer alignment key used in a projection mode aligning according to an embodiment of the present invention, and FIG. 3B is a cross-sectional view taken along line II—II of FIG. 3A. Referring now to FIG. 3A, a first material layer 310 is formed on a semiconductor substrate. First alignment keys 312 are formed in the first material layer 310. A second material layer 320 is formed on the first material layer 310. Second alignment keys 322 are formed in the second material layer 320. A third material layer 330 is formed on the second material layer 320. The alignment keys are arranged in the same manner as that of the FIG. 2A. The alignment keys in one layer are different in length size from that in another layer. For example, the length (B1, B2, B3) ratio between first, second and third alignment keys is about B1:B2:B3= 2:3:5.

Figure 4:
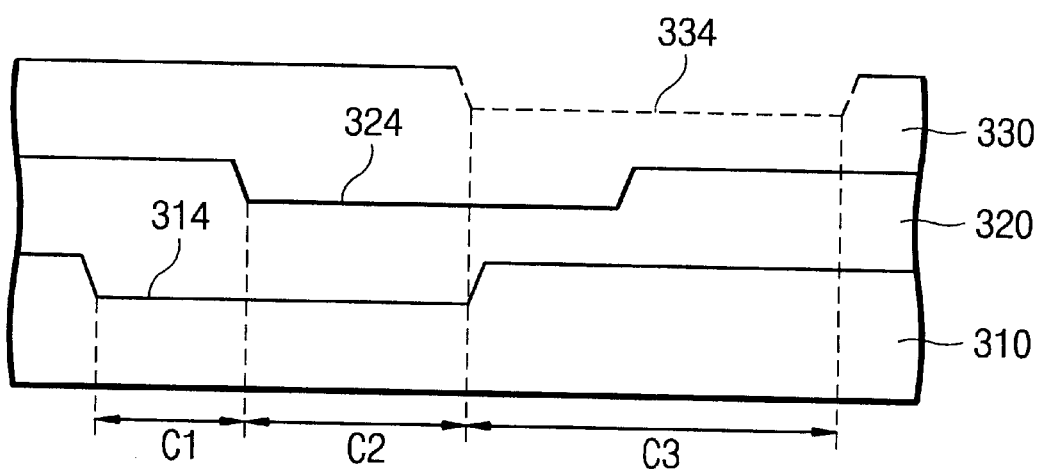
FIG. 4 is a cross-sectional view of another triple layer alignment key used in a projection mode aligning according to an embodiment of the present invention.

FIG. 4 is a cross-sectional view of another triple layer alignment key. Referring to FIG. 4, first, second, and third alignment keys 314, 324, 334 are formed in a first, second and third material layers 310, 320, 330, respectively. Herein, unlike the alignment keys in FIG. 2A and FIG. 3A, the alignment keys are same in size. However, the alignment keys overlap each other seen from a top plan view. Accordingly, multilayer alignment keys with a predetermined length ratio can be obtained by adjusting the degree of overlap. From a top plan view, the exposure ratio between alignment keys is about C1:C2:C3=2:3:5.

Figure 5A:
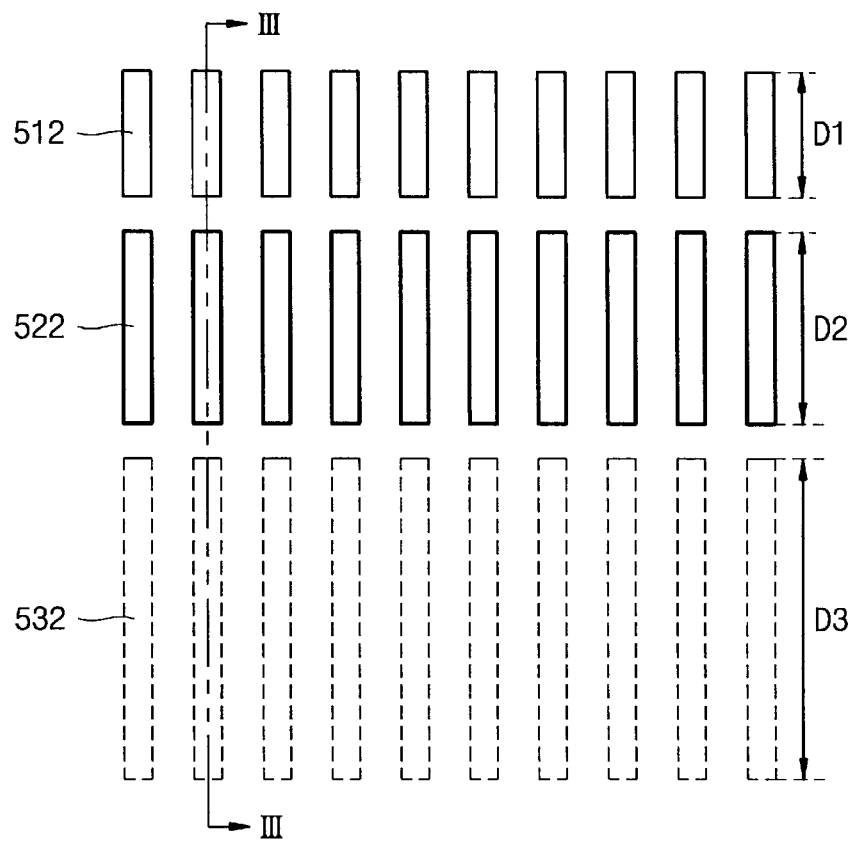
FIG. 5A is a top view of a triple layer alignment key used in a projection mode aligning according to an embodiment of the present invention.
Figure 5B:
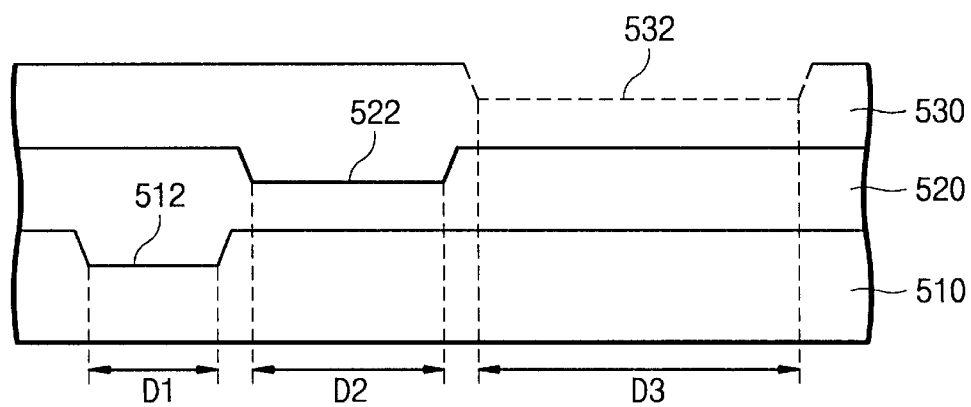
FIG. 5B is a cross-sectional view taken along line III—III of FIG. 5A.

FIG. 5A is a top view of a still another triple layer alignment key, and FIG. 5B is a cross-sectional view taken along line III—III of FIG. 5A. Herein, alignment keys in a different layer are spaced apart from each other as seen from a top plan view. Namely, the shorter sides of the alignment keys are facing but not in contact with each other and spaced apart to a predetermined distance as seen from a top plan view. But as in FIG. 3B, the length of the alignment keys is different from that in another layer. For example, the ratio of length (D1, D2, D3) between alignment keys is about D1:D2:D3=2:3:5.

Figure 6:
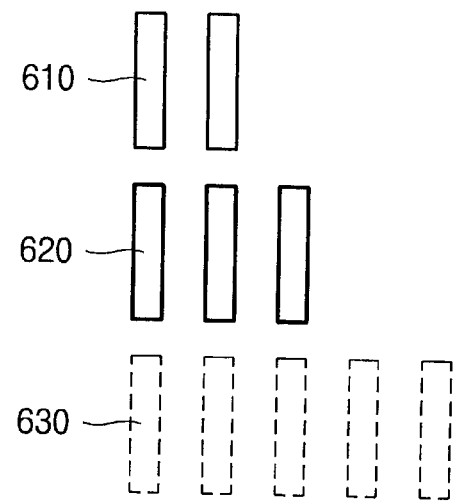
FIG. 6 is a top plan view of an alignment key used in a diffraction mode aligning according to an embodiment of the present invention.

FIG. 6 is a top plan view of alignment keys used in a diffraction mode aligning according to an embodiment of the present invention. Referring to FIG. 6, first, second and third alignment keys 610, 620, 630 are formed in corresponding material layers respectively. Herein, the size of the alignment keys is the same. However, the number of alignment keys is different from each other. For example, the number of the first alignment keys 610 is two, the second alignment keys 620 are three, and the third alignment keys 630 are three. Due to the difference in the alignment key number, alignment weight can be differently imposed on each layer as in the case of different length size.

Figure 7A:
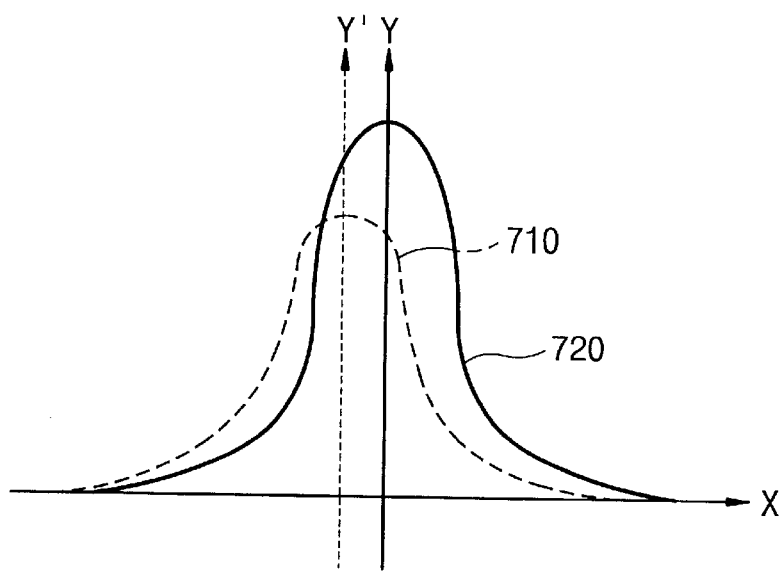
FIG. 7A is a graph showing an electrical signal from alignment keys in each layer, in accordance with the invention.
Figure 7B:
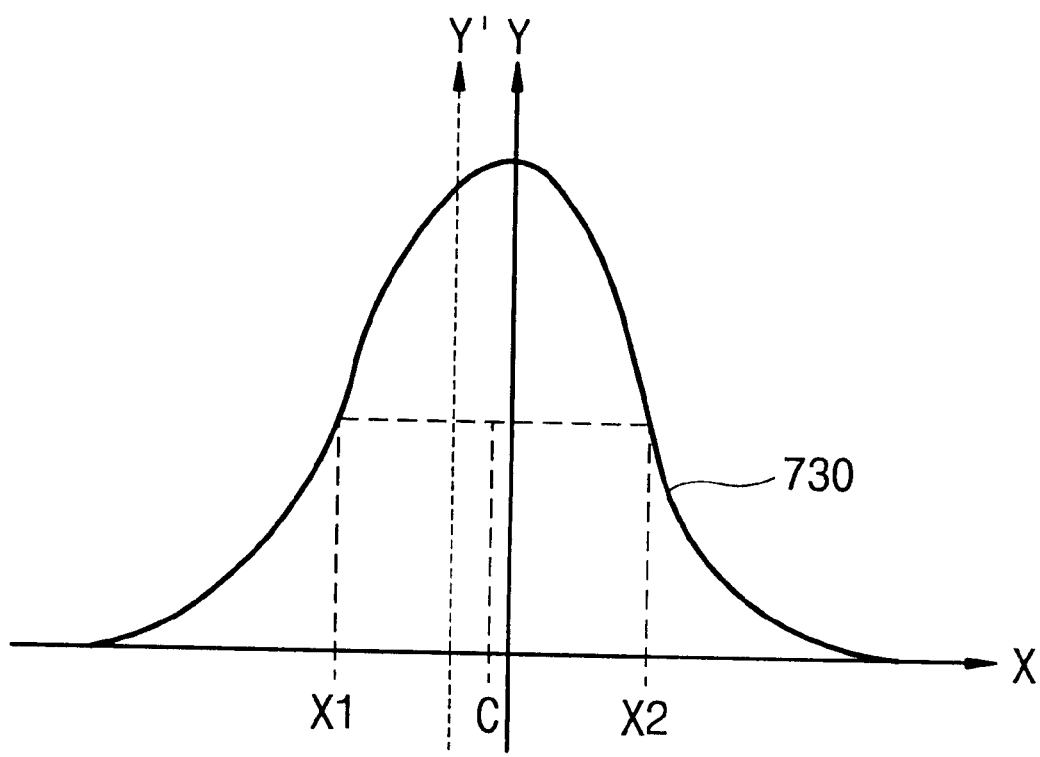
FIG. 7B is a graph showing a convolved version of the signal of FIG. 7A.

FIG. 7A is a graph showing an electrical signal from alignment keys in each layer by scanning method aligning and FIG. 7B is a graph showing a convolved version of the signal of FIG. 7A. The present invention determines alignment position by directing a light into the multilayered alignment keys and collecting information from the reflected light and then convolutioning the collected light. Referring now to FIG. 7A, a broadband light is incidented into a scribe line in which alignment keys are formed. Reflected broadband light is scanned to detect the brightness of the alignment keys thereby obtaining alignment position. Incident light is reflected from the substrate and the alignment keys. The intensity of the reflected light changes depending on the position at which the light is incident and reflected. The alignment keys in each layer are formed in the scribe line when patterns are formed in a chip region. At this time, a reference alignment key is determined, and the length of the other alignment keys is determined with reference to the reference alignment key, thereby imposing a different alignment weight in each layer.

For example, in FIG. 1, alignment keys are formed in each step of forming the device isolation layer, forming the gate pattern 14, and forming the bit line 16b, respectively. Subsequently, the storage node contact hole is formed with reference to the previously-formed alignment keys. At this time, it is required that contact plug 18 be positioned correctly. That is, the contact plug 18 should be positioned on the active region 12 and be spaced apart from the gate pattern 14 and the bit line 16b so as not to cause an electrical connection. Exact alignment of the contact plug 18 is required. To this end, the present invention uses multilayer alignment keys with different alignment weight. The alignment weight of each alignment key can be adjusted.

In FIG. 2, if the first alignment key 212 corresponds to the gate pattern 14 of FIG. 1, and the second alignment key 222 corresponds to the bit line 16b of FIG. 1, first alignment keys 212 and 222 are used as alignment marks for photolithographic processes for the storage electrode contact hole. The density of the reflected light is varied when it is reflected from the alignment keys, thereby detecting the position of the alignment keys. The detector detects the reflected light. The detector detects continuously from left to right, and detects from top to bottom at regular intervals. Through this mode, the reflected light from the first alignment key 212 and the second alignment key 222 are sequentially detected and converted into an electrical signal.

The electrical signals from the alignment keys are shown in FIGS. 7A and 7B. In FIG. 7A, first electrical signal 710 corresponds to the detected light from the first alignment key 212, and second electrical signal 720 corresponds to that of the second alignment key 720. Herein the first and second electrical signals 710 and 720 are reverse signals. Since light reflected from the alignment key is darker relative to the surroundings, the intensity of the light is reduced. Accordingly, the shape of the electrical signal will be a parabola with minima. However, the reversed shape thereof (i.e., parabola with maxima) is used in the drawing for the explanation of diffraction mode aligning, as shown in FIG. 7A. In FIG. 7A, the x-axis represents the position of the alignment key and the y-axis represents the intensity of the reflected light, i.e., the electrical signal.

The x value corresponding to the maximum value of y represents the position of the alignment key. In FIG. 7A, the maximum value of each signal is different. This is because the alignment weight is different among the alignment keys. More particularly, the length of the alignment keys is different from one another, as shown in FIGS. 2A and 2B. The intensity of the reflected light is dependent on the length of the alignment keys. For example, the length ratio of the alignment keys in FIGS. 2A and 2B is about 3:7, the ratio of the reflected light also is about 3:7, since the detector detects the reflected light from top to bottom at a regular interval. The length of the second alignment key is larger than that of the first alignment key. This means that greater alignment weight is imposed on the bit line 16b than the gate pattern 12.

In FIG. 7A, each electrical signal 710 and 720 has different maximum value in y. This is due to the different alignment weight. Also each signal has a different symmetric axis, i.e., has different x value corresponding to the each maximum y value. Namely, the symmetric axis of the first signal 710 is Y' and that of the second signal is Y. The two signals are convolved to form an asymmetric third signal 730 as shown in FIG. 7B. Asymmetry of the convolved signal results from the fact that each alignment keys are formed in a different length. A reference value corresponding to predetermined ratio of the maximum y value is determined in the third signal 730. For example, 50% of the maximum y value is determined as the reference value. Then, two x values (X1, X2) corresponding to the reference value are obtained. Since the third signal 730 is asymmetric, X1 and X2 are also asymmetric. The middle point is then determined as alignment position for the storage node contact.

Referring to FIG. 6, alignment by the diffraction mode aligning will now be described. Referring to FIG. 6, the number of the alignment key is different from one another. For example, the number of the first alignment key 610 is two, that of the second alignment key 620 is three, and that of the third alignment key 630 is five. Light used in this diffraction mode is a monochrome ray. The monochrome ray can be obtained by using a laser and is advantageously used to perceive interference and diffraction phenomena, and to obtain diffraction patterns from the alignment keys. When incident light is reflected from the substrate, light diffracts at the alignment key. At this time, each diffraction pattern is obtained by indenting light into each layer. Diffraction theory says that the distance and number of the crystalline lattice therebetween can be obtained by analyzing the diffracted light. Therefore, the position of the alignment keys and the number of the alignment keys can be obtained in each layer. At this time, arrangement of the alignment keys serves as diffraction grating. The alignment weight is dependent on the number of the alignment key.

After obtaining a basic signal in each layer, the alignment weight that is proportional to the number of the alignment key is multiplied by the corresponding basic signal. Let the maximum value of the basic signal be 1. Then, the resulting maximum value of the signal from the first alignment key is 2, which is calculated by multiplying the alignment weight 2 (the number of the first alignment key is two). Likewise, the maximum value of the signal from the second alignment key is 3, and the maximum value of the signal from the third alignment key is 5. The maximum value of the signal is proportional to the number of the alignment key.

Accordingly, in case that two alignment keys are formed, the resulting signals resemble that shown in FIG. 7A. Determining the position of the alignment key is identical to the scanning method described above.

As described above, the present invention uses multilayer alignment keys for aligning accuracy. Furthermore, the present invention provides a different alignment weight to each alignment key, by forming alignment keys with a different length in each layer or with a different number of keys in each layer.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. Alignment keys for aligning layers in an integrated structure, comprising:

a substrate; and multiple stacked layers formed over the substrate, each of the multiple stacked layers including at least one alignment key disposed in the layer along a first direction, one or more other alignment keys in one or more respective other layers being disposed along the first direction such that a plurality of alignment keys in a respective plurality of layers are in alignment.

2. The alignment keys according to claim 1, wherein the alignment keys have a rod-like rectangular shape.

3. The alignment keys according to claim 2, wherein the length of an alignment key in a first layer is different from that of another alignment key in another layer.

4. The alignment keys according to claim 1, wherein the alignment keys have concave shapes.

5. The alignment keys according to claim 1, wherein the alignment keys have convex shapes.

6. The alignment keys according to claim 2, wherein the number of alignment keys in a first layer is different from the number of alignment keys in another layer.

7. The alignment keys according to claim 2, wherein a portion of at least one alignment key in a first layer is overlapped by another alignment key in another layer.

8. The alignment keys according to claim 7, wherein an amount of the overlap differs at each layer.

9. A method for making alignment keys on a substrate and determining an alignment position of the substrate comprising:

forming multilayered alignment keys on the substrate such that the alignment keys on multiple layers are arranged in the same direction such that multiple alignment keys on multiple layers are in alignment;

directing light into the substrate having the multilayered alignment keys;

receiving information from light incident upon the substrate and alignment keys; and determining an alignment position using the received information.

10. The method according to claim 9, wherein the length of the alignment keys in a first layer is different from that of another alignment key in another layer.

11. The method according to claim 9, wherein:

the alignment keys have rod-like rectangular shape and are the same size; and a portion of an alignment key in one layer overlaps another alignment key in another layer.

12. The method according to claim 9, wherein the number of alignment keys in a first layer is different from the number of alignment keys in another layer.

13. The method according to claim 12, wherein the length of the alignment keys in a first layer is the same as the length of another alignment key in another layer.

14. The method according to claim 9, wherein a broadband light is directed into the entire area of the substrate where the multilayered alignment keys are formed.

15. The method according to claim 14, wherein the step of receiving information comprises:

downward detecting scattered and/or reflected light from the alignment keys in each layer and converting the detected light to an electrical signal; and performing a convolution on the electrical signal.

16. The method according to claim 15, wherein downward detecting is carried out at a predetermined interval in a discrete time manner.

17. The method according to claim 9, wherein the light is monochromatic light.

18. The method according to claim 9, wherein the step of receiving the information comprises:

detecting diffracted light from the alignment keys in each layer;

determining the number of alignment keys in each layer using the diffracted light and imposing an alignment weight on each layer; and introducing an imaginary signal to each layer and applying the alignment weight to the corresponding imaginary signal.

19. The method according to claim 9, wherein determining the alignment position comprises:

performing convolutions on electrical signals from each alignment key and obtaining a relation in an X-Y coordinate system;

obtaining a maximum Y value;

obtaining a reference Y value that has a predetermined ratio with respect to the maximum Y value; and obtaining two X values from the reference Y value and determining a middle point of the two X values as the alignment position.

20. The method according to claim 19, wherein the X-axis represents the position of the alignment keys.

21. The method according to claim 19, wherein the Y-axis represents the intensity of the electrical signals.

* * * * *